United States Patent [19]

Bae

[11] Patent Number: 4,929,852

[45] Date of Patent: May 29, 1990

[54] TTL TO CMOS INPUT BUFFER CIRCUIT

[75] Inventor: Myung H. Bae, Songtan, Rep. of Korea

[73] Assignee: Samsung Semiconductor & Telecommunications Co., Gumi, Japan

[21] Appl. No.: 225,848

[22] Filed: Jul. 29, 1988

[30] Foreign Application Priority Data

Aug. 1, 1987 [KR] Rep. of Korea .................... 87-8475

[51] Int. Cl.[5] .......................................... H03K 19/094
[52] U.S. Cl. .................................... 307/475; 307/446; 307/451; 307/296.1
[58] Field of Search ................ 307/447, 448, 451, 475, 307/290, 446, 296.1

[56] References Cited

U.S. PATENT DOCUMENTS

| | | | |
|---|---|---|---|
| 4,191,898 | 3/1980 | Ulner | 307/475 X |
| 4,342,928 | 8/1982 | Gschwendtner et al. | 307/264 X |
| 4,380,710 | 4/1983 | Cohen et al. | 307/451 X |
| 4,430,582 | 2/1984 | Bose et al. | 307/475 X |
| 4,437,024 | 3/1984 | Wacyk | 307/475 |
| 4,471,242 | 9/1984 | Noufer et al. | 307/475 |
| 4,555,642 | 11/1985 | Morales | 307/475 |
| 4,563,595 | 1/1986 | Bose | 307/475 X |
| 4,584,492 | 4/1986 | Sharp | 307/443 X |
| 4,783,603 | 11/1988 | Goforth et al. | 307/475 X |
| 4,783,607 | 11/1988 | Hsieh | 307/475 |

Primary Examiner—David Hudspeth
Attorney, Agent, or Firm—Cushman, Darby & Cushman

[57] ABSTRACT

A TTL to CMOS buffer circuit includes a first buffer receiving a TTL input and a second buffer providing a CMOS output. The first buffer has a first power input connected to Vcc, a second power input connected through a resistor to Vcc, and a third power input connected to Vss. The second buffer has a first power input connected to Vcc, a second power input connected through a resistor to Vss, and a third power input connected to Vss. In the first buffer, two PMOS transistors and three NMOS transistors are serially connected by their current electrodes between the second and the third power input, in that sequence; the second power input is connected to the P channel transistor end of the series and the third power input is connected to the N channel end of the series. In the second buffer, two PMOS transistors and one NMOS transistor is serially connected by their current electrodes in that sequence between the first and the second power inputs; the first power input is connected to the P channel transistor end of the series, and the second power input is connected to the N channel end of the series. The first buffer's first power input is connected to the gate of an NMOS transistor in that buffer, and the second buffer's third power input is connected to the gate of a PMOS transistor in that buffer.

14 Claims, 4 Drawing Sheets

TTL TO CMOS INPUT BUFFER CIRCUIT

BACKGROUND AND FIELD OF THE INVENTION

This invention relates to a buffer circuit receiving a TTL input and providing a C-MOS output. Ideally, the stand-by current when the buffer does not operate should be minimal; the difference in circuit speed between that based on a high input and that based on a low input should be minimal, as circuit speed does not overly depend on the input value; the difference in circuit speed between that with one Vcc level and that with a different Vcc level should be minimal; the set-up time and the hold time of address and of data should be stable and easy to control; and the margin of respective high and low input voltage levels should be adequate. Traditional buffer circuits in the prior art are less than ideal and there exists much room for improvement.

SUMMARY OF THE INVENTION

A TTL to CMOS input buffer is provided including a first buffer part receiving the TTL input and a second buffer part receiving a signal from the first buffer part and providing a CMOS output. The first buffer part includes a buffer having three power supply inputs; the first power input is connected to a source Vcc; the second power input is connected through a resistor to a source Vcc; and the third power input is connected to a ground source Vss. The second buffer part includes a buffer having three power supply inputs; the first power input is connected to a source Vcc; the second power input is connected through a resistor to a ground source Vss; and the third power input is connected to a ground source Vss.

DETAILED DESCRIPTION

Figure 3:
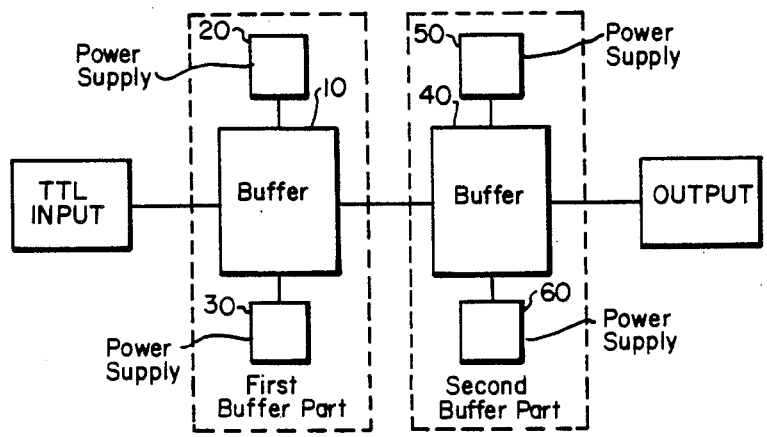
FIG. 3 illustrates a block diagram of a traditional buffer of the prior art.
Figure 4:
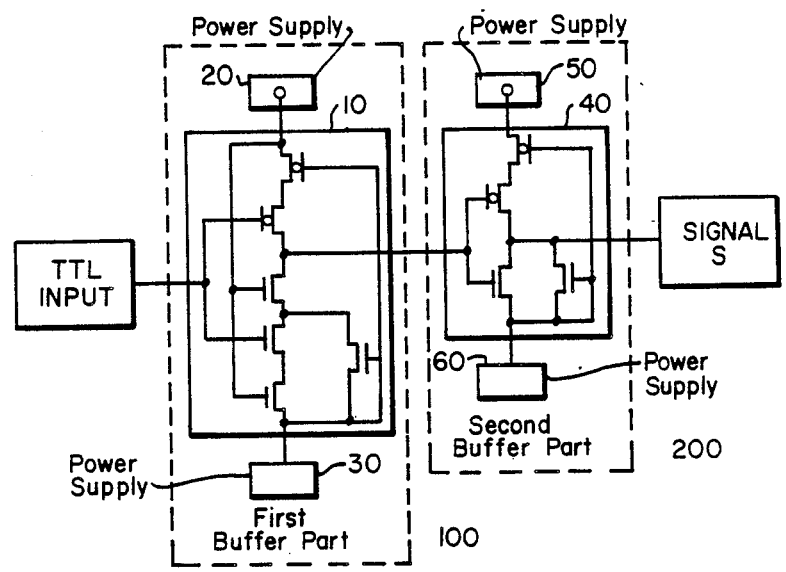
FIG. 4 illustrates the electrical circuit diagram of the traditional buffer of FIG. 3.

A traditional buffer circuit in the prior art is shown in FIG. 3 in a block diagram. The buffer circuit includes a first buffer part 100 receiving TTL input signal and a second buffer part 200 providing a C-MOS output signal. The first buffer part includes a buffer 10 and two power supplies 20 and 30 separately connected to buffer 10. The second buffer part includes a buffer 40 and two power supplies 50 and 60 separately connected to buffer 40. And buffer 10 of the first buffer part supplies a signal as input to the second buffer part. An electrical circuit diagram of such a traditional buffer circuit is shown in FIG. 4.

Figure 1:
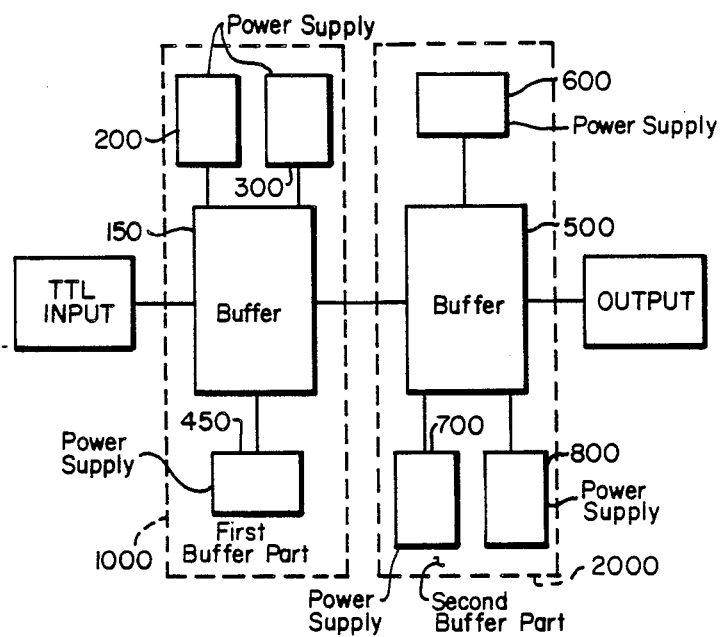
FIG. 1 illustrates a block diagram of the present invention.

A block diagram of the present invention is shown in FIG. 1. A first buffer part 1000 receives a TTL input signal and is connected to a second buffer part 2000 which provides the output of the present invention. The first buffer part includes a buffer 150, a first power supply 200, a second power supply 300, and a third power supply 450; the first and second power supplies are connected to one side of the buffer 150 and the third power supply is connected to an opposing side of buffer 150. The second buffer part includes a buffer 500 which receives the output from buffer 150 within the first buffer part, a first power supply 600, a second power supply 700, and a third power supply 800; the first power supply is connected to one side of buffer 500 and the second and third buffer supplies are connected to an opposing side of buffer 500.

Figure 2:
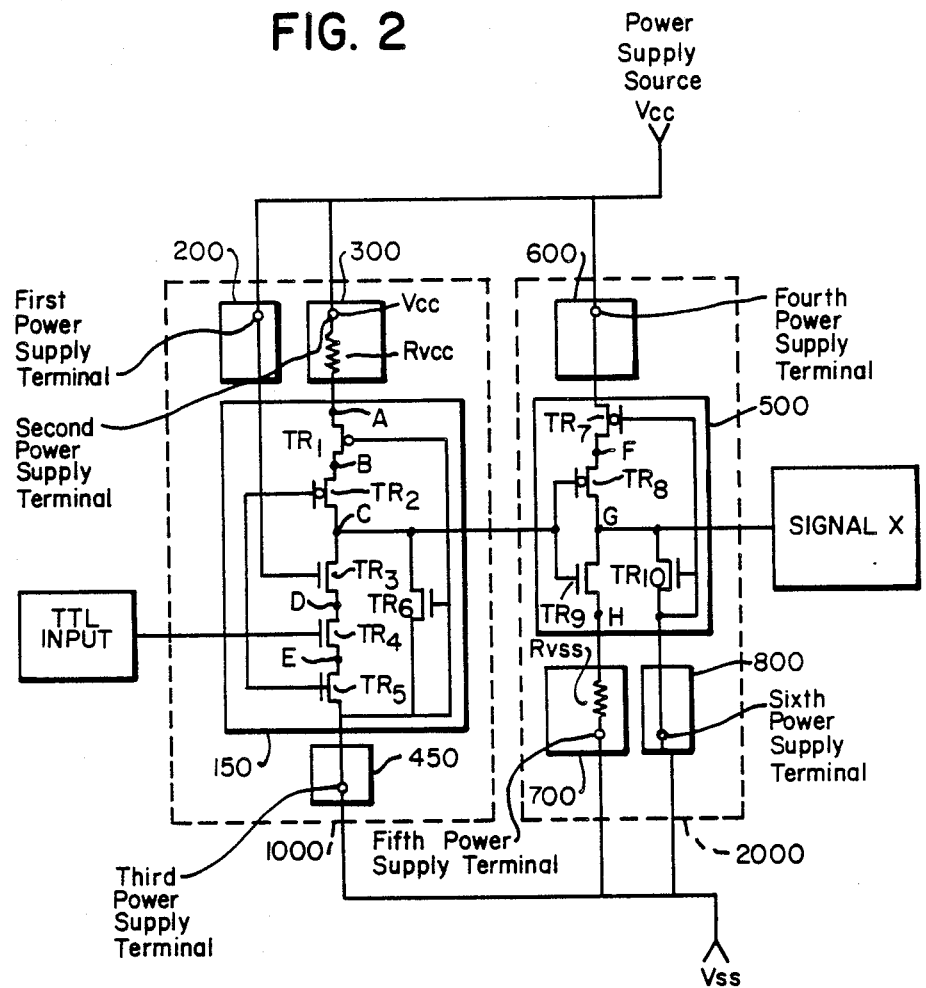
FIG. 2 illustrates the electrical circuit diagram of the invention of FIG. 1.

As indicated in FIG. 2, the first power supplies 200 and 600 respectively supplies Vcc from an external source; the third power supplies 450 and 800 respectively supplies ground source Vss from an external source; the second power supply 300 supplies a voltage dropped from an external source Vcc by Vcc through resistor RVcc; the second power supply 700 supplies a voltage offset by Δ Vss through resistor RVcc from an external ground source Vss.

In the first buffer part 1000, the current electrodes of five transistors TR1, TR2, TR3, TR4, and TR5 are connected in series and in that sequence. TR1 and TR2 are P channel MOS transistors and TR3, TR4, and TR5 are N channel MOS transistors. Power supply 300 is connected to a current electrode of TR1 opposing that connected to TR2, and power supply 450 is connected to the source electrode of TR5 whose other current electrode is connected to TR4. The gate electrode of TR2, TR4, and TR5 are connected to the TTL input. Power supply 200 is connected to the gate electrode of TR3. Also within the first buffer part 1000 is an N channel MOS transistor TR6 whose gate electrode is connected to the gate electrode of TR1; the source and gate electrodes of TR6 are connected to the source electrode of TR5; and the drain electrode of TR6 is connected to the point of serial connection between TR2 and TR3. First buffer part 1000 provides an output from the drain electrode of TR6 to the second buffer part 2000.

In the second buffer part 2000, the current electrodes of three transistors TR7, TR8, and TR9 are connected in series and in that sequence. TR7 and TR8 are P channel MOS transistors and TR9 is an N channel MOS transistor. The gate electrodes of TR7 and TR8 are connected to the drain electrode of TR6 within first buffer part 1000. The first power supply 600 is connected to a current electrode of TR7 opposite that connected to TR8, and the second power supply 700 is connected to the source electrode of TR9 whose drain is connected to TR8. Also within the second buffer part 2000 is another N channel MOS transistor TR10 whose gate and source electrodes are connected to the gate electrode of TR7 and also to the third power supply 800, and whose drain electrode is connected to the point of serial connection between the current electrodes of TR8 and TR9. The second buffer part 2000 provides output signal X from the point of serial connection between TR8 and TR9.

At node A, the voltage is Vcc minus that dropped through resistor RVcc. Node B represents the point of connection between TR1 and TR2; node C represents the point of connection between TR2 and TR3; node D represents the point of connection between TR3 and TR4; node E represents the point of connection between TR4 and TR5; node F represents the point of connection between TR7 and TR8; node G represents the point of connection between the current electrodes of TR8 and TR9; node H represents the point of connection between TR9 and second power supply 700.

During circuit operation, when the TTL input is in stand-by state at (2.4 V, node A has the voltage Vcc−Δ Vcc. TR1 causes the voltage at node B to become equal to that at node A, because the absolute value of the difference in voltage between that at its gate (Vss) and that at node A (Vcc−Δ Vcc) is greater than the absolute value of its threshold voltage of about 1.0 V.

TR2 in an on state causes the voltage at node C to become equal to that at node B, because the absolute value of the difference in voltage between that at its gate (2.4 V) and that at node B (Vcc−Δ Vcc−(2.4 V) is greater than the absolute value of its threshold voltage. TR5 in an on state causes the voltage at node E to become equal to that supplied by power supply 450 (ground source Vss), because the difference in voltage between that at its gate (2.4 V) and Vss is greater than its threshold voltage of about 0.8 volts. TR4 in an on state causes the voltage at node D to become equal to that at node E (Vss if TR5 is on), because the difference in voltage between that at its gate (2.4 V) and that at node E, (2.4 V−Vss, is greater than its threshold value. TR3 causes the voltage at node C to become equal to that at node D (Vss if TR5 and TR4 are on), because the difference in voltage between that at its gate and that at node D is Vcc−Vss, a value greater than the threshold voltage of TR3.

Consequently, a constant current always flows from power supply 300 (through resistor RVcc from external source Vcc) to node C through resistor, TR1, and TR2. Similarly, a constant current flows from node C to power supply 450 (ground source Vss) through TR3, TR4, and TR5. The voltage at node C is determined by the amount of current flow into and out of node C.

In the stand-by state, node C has a constant voltage almost the same as ground source Vss, because the current flow from node C to power supply 450 is greater than the current flow from power supply 300 to node C. TR10 is always off as its gate is grounded through power supply 800 supplying ground Vss. TR7 is always on and causes the voltage at node F to become equal to that supplied by power supply 600 (Vcc), because the absolute value of the difference in voltage between that at its gate and that of power supply 600, Vcc−Vss, is greater than the threshold voltage of TR7. TR8 is always on and causes the voltage at node G to become equal to that at node F (Vcc if TR7 is on), because the voltage at node C is almost the same as ground source Vss and because the absolute value of the difference in voltage between that at its gate and that at node F is greater than the absolute value of the threshold voltage of TR8. Output signal X is taken from node G. TR9 is off because the voltage at node C is almost near ground source Vss and because the voltage at node H is Vss+Δ Vss; the absolute value of the difference in voltage between that at the gate of TR9 and that at node H is less than TR9's threshold voltage.

When the voltage of the TTL input is changed from $V_{IH}$ (input high voltage=(2.4 V) to $V_{IL}$ (input low voltage=0.8 V), the current flow from power supply 300 to node C increases because the absolute value of the difference in voltage between that at the gate of TR2 and that at node D increases.

When the difference in voltage between that at the gate of TR5 and power supply 450 (ground source Vss) and between that at the gate of TR4 and that at node E decreases respectively, the amount of current flow from node C to power supply 450 (ground source Vss) decreases. When $V_{IL}$ reaches 0.8 V, TR4 and TR5 are nearly off and the voltage at node C becomes high at Vcc−Δ Vcc.

When the voltage at node C becomes high, TR8 is turned off because the absolute value of the difference in voltage between that at node C and that at node F is smaller than the absolute value of the threshold voltage of TR8; TR9 is turned on because the absolute value of the difference in voltage between that at its gate and that at node H is greater than its threshold value. When TR9 is turned on, the voltage at node G becomes equal to that supplied from power supply 700 (Vss+Δ Vss) and is provided as output signal X in a low state.

When TTL input voltage increases from $V_{IL}$ (0.8 V) to $V_{IH}$ (2.4 V), the amount of current flow into node C through TR2 decreases and the amount of current flow out of node C to power supply 450 (ground source Vss) through TR4 and TR5 increases. The voltage at node C becomes low, turning off TR9, turning on TR8. and making the output signal X become high at Vcc.

The invention as described above minimizes the amount of stand-by current, minimizes the change in speed with respect to the change in TTL input voltage, minimizes the change in speed with respect to changes in the power supply (external source Vcc), and provides a wide-range margin for the input voltage.

With regard to minimizing the stand-by current, when Vcc=6 V and at a low temperature of −10° C., much current flows. But at that condition, when the TTL input is 2 V, the subject invention as shown in FIG. 2 yields a current flow of 0.18 mA, whereas the optimized traditional circuit shown in FIG. 3 yields a current flow of 0.37 mA. Thus, the improvement provided by this invention is represented by a reduction in current by about 50%. In this invention, the current flow into the buffer circuit through TR1 is reduced because resistor RVcc reduces the voltage supplied to TR1 from Vcc to Vcc−Δ Vcc. Thus, the amount of stand-by current is reduced.

Figure 5A:
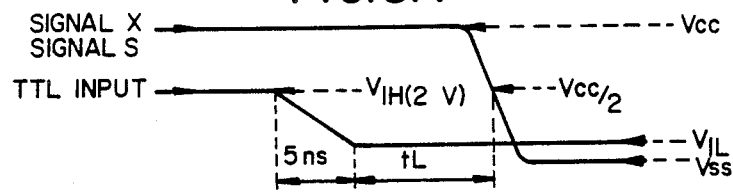
FIG. 5A defines the speed of a buffer circuit when the TTL input changes from high to low, which is used as a basis of comparison of the present invention with the traditional buffer of the prior art.
Figure 5B:
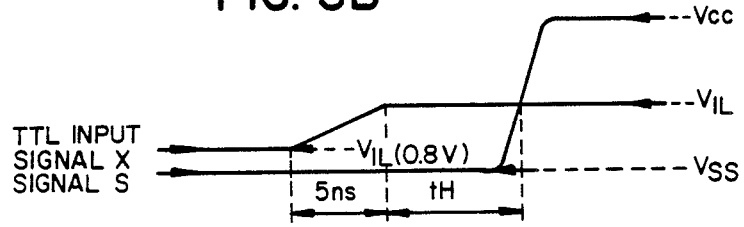
FIG. 5B defines the speed of a buffer circuit when the TTL input changes from low to high, which is used as a basis of comparison of the present invention with the traditional buffer of the prior art.

With regard to minimizing the change in speed relative to the change in TTL input voltage, the effect is shown in FIGS. 5 and 6. The speed referred to is based on respective time periods $t_L$ (TTL input going from high to low) and $t_H$ (TTL input going from low to high) required from the time the TTL input has reached its changed level for the output signal (X and S) to reach the middle of its transition to a different level.

Table 1 below illustrates a comparison of $t_I$, $t_h$, and $[t_h - t_L]$ between a traditional circuit and the subject invention, with $V_{IH}$=(2.4 V and $V_{IL}$=0.8 V at the specified conditions.

TABLE 1

| condition | the traditional circuit(ns) | | | the circuit of the invention(ns) | | |
| --- | --- | --- | --- | --- | --- | --- |
| | $t_L$ | $t_H$ | $\|t_H-t_L\|$ | $t_L$ | $t_H$ | $\|t_H-t_L\|$ |
| 1  4 V/100° C. | 0.9 | −0.7 | 1.6 | 1.2 | 0.4 | 0.8 |
| 2  6 V/−10° C. | −2.0 | 0 | 2.0 | −0.6 | 1.0 | 1.6 |
| 3  \|1−2\| | 2.9 | 0.7 | | 1.8 | 0.6 | |

As indicated by Table 1, the TTL to CMOS buffer of the present invention reduces the difference between $t_H$ and $t_L$, when the input varies from $V_{IH}$ and $V_{IL}$. Additionally, as shown in table 1, for the traditional circuit, the difference between the slowest $t_L$ and the slowest $t_H$ is 0.9 ns, whereas that difference for the subject invention is much smaller, 0.2 ns.

The set-up time and hold time of the buffer are made m re stable by a reduction in the difference between $t_H$ and $t_L$, because a difference between $t_H$ and $t_L$ is reflected in a difference between the set-up time and the hold time. The small difference between $t_H$ and $t_L$ can also be noted in FIG. 5.

In the embodiment shown in FIG. 2, when the input voltage changes from $V_{IH}$ (2.4 V) to $V_{IL}$ (0.8 V), because the difference in voltage between that at the gate and at the source of TR4 and R5 becomes almost or exactly the same as their threshold voltage, they are both turned off. Thus, the voltage at node C is high, as no current flows from node C to ground source Vss in power supply 450. The high voltage at node C turns off TR8, and turns on TR9, thereby causing output signal X (voltage at node G) to become low as node G is thus connected to ground source Vss.

When TTL input changes from $V_{IL}$ (0.8 V) to $V_{IH}$ (2.4 V), the current flow into node C through TR1 and TR2 (which are continuously on) is reduced, and TR3, TR4, and TR5 are turned on to increase current flow from node C to ground source Vss through power supply 450. In that circumstance, it takes a long time for the voltage at node C to change from high to low and for output signal X at node G to go high. Thus, a difference between $t_L$ and $t_H$ exists, as input varies between $V_{IH}$ and $V_{IL}$. In the present invention, that difference is reduced by a reduction in the amount of current flow from node C to ground source Vss in power supply 450 by including a resistor RVcc within power supply 300 which then supplies Vcc through resistor RVcc. That difference is also reduced by more rapidly causing output signal X to change to high through more quickly turning off TR9 when the voltage at node C goes low; that is made possible by the inclusion of a resistor RVss in power supply 700 which then supplies ground source Vss through resistor RVss to node H which would have a voltage Vss+Δ Vss.

The size of TR4 and TR5 are enlarged to prevent $t_H$, when Vcc=6 V/−10° C., from becoming too large (circuit too slow); $t_H$ is very slow when Vcc=6 V/−10° C. Because of that enlargement, when Vcc=4 V/100° C., $t_H$ is less than $t_L$ (circuit being faster).

For illustrating the subject invention's minimizing the variation in speed relative to a change in Vcc or other external voltage supply, Tables 2A and 2B are presented below. Table 2A illustrates the case for $V_{IH}$=2.4 V constant and $V_{IL}$ takes on several values as the power source supplying Vcc is changed. Table 2B illustrates the case for $V_{IL}$=0.8 V constant and $V_{IH}$ takes on several values as the power source supplying Vcc is changed. The results for both a traditional buffer and for the present invention are shown in Tables 2A and 2B for comparison.

TABLE 2A

| | the traditional circuit | | | the circuit of the present invention | | |
| --- | --- | --- | --- | --- | --- | --- |
| | $t_L$ (ns) | | | $t_L$ (ns) | | |
| $V_{IL}$ (V) | 4 V/ 100° C. | 6 V/ −10° C. | $\Delta t_L$ (ns) | 4 V/ 100° C. | 6 V/ −10° C. | $\Delta tl$ (ns) |
| 0.8 | 0.9 | −2.0 | 2.9 | 1.2 | −0.6 | 1.8 |
| 0.9 | 1.2 | −1.8 | 3.0 | 1.6 | −0.4 | 2.0 |
| 1.0 | 1.7 | −1.7 | 3.4 | 2.1 | −0.2 | 2.3 |
| 1.1 | 2.7 | −1.5 | 4.2 | 2.9 | 0.0 | 2.9 |
| 1.2 | 5.2 | −1.3 | 6.5 | 4.4 | 0.3 | 4.1 |

TABLE 2B

| | the traditional circuit | | | the circuit of the present ivention | | |
| --- | --- | --- | --- | --- | --- | --- |
| | $t_H$ (ns) | | | $t_H$ (ns) | | |
| $V_{IH}$ (V) | 4 V/ 100° C. | 6 V/ −10° C. | $\Delta t_H$ (ns) | 4 V/ 100° C. | 6 V/ −10° C. | $\Delta t_H$ (ns) |
| 2.4 | −0.7 | 0.0 | 0.7 | 0.4 | 1.0 | 0.6 |
| 2.3 | −0.5 | 0.3 | 0.8 | 0.7 | 1.4 | 0.7 |
| 2.2 | −0.3 | 0.6 | 0.9 | 0.9 | 2.0 | 1.1 |
| 2.1 | −0.2 | 1.1 | 1.3 | 1.1 | 2.9 | 1.8 |
| 2.0 | 0.1 | 3.1 | 2.9 | 1.5 | 4.2 | 2.7 |
| 1.9 | 0.3 | 6.1 | 5.8 | 1.9 | 6.5 | 4.6 |

As shown above in tables 2A and 2B, the values of $t_L$ and $t_h$ are reduced by the present invention. Variations in $t_L$ and $t_H$ due to changes in the level of external power source Vcc affects the buffer circuit's operational speed when the TTL input is a control signal, and affects the set-up time and hold time of the buffer circuit when the TTL input signal is an address or is data.

The present invention stabilizes the buffer circuit's overall operational speed, and also stabilizes the set-up time and hold time of address and of data with respect to changes in power supply source Vcc, because of the reduction in the circuit's change in speed due to changes in source Vcc. The buffer circuit's operational speed is stabilized with respect to changes in Vcc, because resistor RVcc is used in power supply 300 to connect source Vcc to the buffer circuit and because resistor RVss is used in power supply 700 to connect external ground source Vss to the buffer circuit.

To discuss circuit conditions when there is a change in Vcc, the following designations are used. For a high Vcc, VccH represents Vcc high; Δ VccH represents the voltage across resistor RVcc; and Δ VssH represents the voltage across resistor RVss when TR9 is turned on. For a lower Vcc, VccL represents Vcc; Δ VccL represents the voltage across resistor RVcc; and Δ VssL represents the voltage across resistor RVss when TR9 is turned on.

Because VccH> VccL

Δ VccH>Δ VccL

Δ VssH>Δ VssL

With reference to FIG. 2, the voltage at node A when Vcc=VccH is VccH−Δ VccH; and the voltage at node A when Vcc=VccL is VccL−Δ VccL. The change in voltage at node A, when Vcc takes on respective different values (VccH and VccL) is computed by taking the difference between (VccH−Δ VccH) and (VccL−Δ VccL):

$$\frac{(VccH - \Delta VccH) - (VccL - \Delta VccL)}{(VccH - VccL) - (\Delta ccH - \Delta VccL)} \text{ equals}$$

That result indicates that the change in voltage at node A, when Vcc takes on respective different values of VccH and VccL, is smaller in value (by $\Delta$ VccH$-\Delta$ VccL) than the variation in external source Vcc.

When TR9 is turned on and where Vcc=VccH, the difference in voltage between the gate and source of TR9 is VccH$-\Delta$ VssH and is designated as $V_{G51}$. When TR9 is turned on and where Vcc=VccL, the difference in voltage between the gate and source of TR9 is VccL$-\Delta$ VccL and is designated $V_{G52}$. The difference between $V_{G51}$ and $V_{G52}$ is computed as follows:

$$V_{G51} - V_{G52} = VccH - VccL - (\Delta VssH - \Delta VssL)$$

That difference is less than VccH$-$VccL, the variation in the source Vcc. Thus, the incorporation of resistors RVcc and RVss in the present invention has reduced the impact of changes in the source Vcc.

Figure 6A:
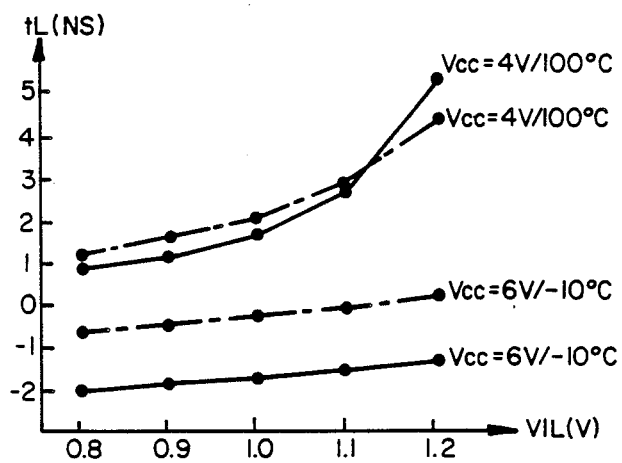
FIG. 6A illustrates a graph of the buffer's speed (both for the present invention and for the prior art) as the voltage of a low TTL input signal is increased, for separate Vcc levels.
Figure 6B:
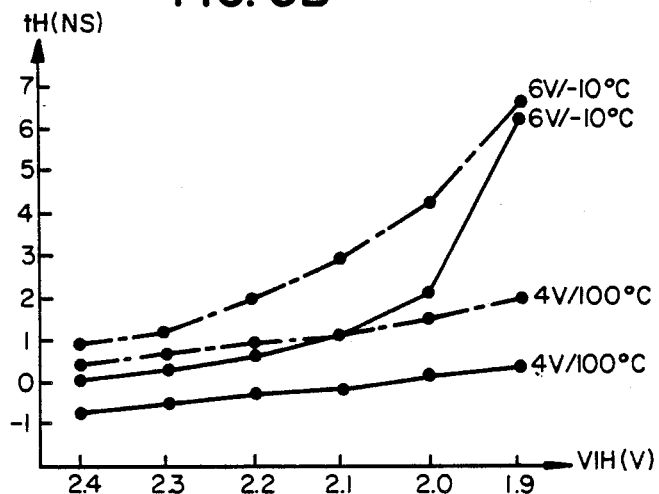
FIG. 6B illustrates a graph of the buffer's speed (both for the present invention and for the prior art) as the voltage of a high TTL input signal is decreased, for separate Vcc levels.

FIGS. 6A and 6B illustrate the wide-range of input margin obtained by the present invention for the TTL input voltage. With reference to FIG. 6A, when Vcc=4 V/100° C. and as $V_{IL}$ increases, t of both a traditional circuit and of the present invention increase, and both increase in a progressively faster rate. But $t_L$ in a traditional circuit eventually exceeds and increases toward infinity at a faster rate than that of the present invention. The bigger is $t_L$, the slower is the circuit. When $V_{IL}$ exceeds a given point, $t_L$ would become so high that the buffer circuit would not be able to receive properly a low TTL input voltage. As is shown in FIG. 6A, the traditional circuit would reach that point earlier than would the present invention. Consequently, the present invention would operate to receive a wider range of low input voltage Vil, and thus has a wider $V_{IL}$ margin.

With reference to FIG. 6B, when Vcc=6 V/$-$10° C. and as $V_{IH}$ decreases, $t_H$ of both a traditional circuit and of the present invention increase, and both increase in a progressively faster rate. But $t_H$ in a traditional circuit eventually increases at a faster rate than that of the present invention towards infinity. When $V_{IH}$ gets to be less than a given point, $t_H$ would become so high that the buffer circuit would not be able to receive properly a high input TTL voltage. As is shown in FIG. 6B, a traditional buffer circuit would reach that point sooner than would the present invention. Consequently, the present invention would operate to receive a wider range of high input voltage $V_{IH}$, and thus has a wider $V_{IH}$ margin.

In accordance with the invention as described above, when numerous TTL input buffers are used, as in a memory circuit, the stand-by current for all such buffers are reduced; when the TTL input is an address or is data, the set-up time and hold time are stabilized by minimizing the difference between $t_H$ and $t_L$ and by minimizing variations in $t_H$ and $t_L$ relative to changes in source Vcc; the reduction in the variations in $t_H$ and $t_L$ due to changes in source Vcc also stabilizes the buffer circuit's operational speed when the TTL input is a control signal; a wider margin of voltage variation is acceptable as a high input signal (2.4 V and lower voltages) and as a low input signal (0.8 V and higher voltages) than that which is accepted by a traditional buffer circuit.

I claim:

1. A TTL to CMOS input buffer comprising:
   a first buffer receiving a TTL input signal and a second buffer receiving an input from said first buffer and providing a CMOS output signal;
   said first buffer having first, second, and third power supply inputs; said first power input of said first buffer is connected to a source Vcc; said second power input of said first buffer is connected through a resistor to a source Vcc; and said third power input of said first buffer is connected to a source Vss; and
   said second buffer having a first, second, and third power supply inputs; said first power input of said second buffer is connected to a source Vcc; said second power input of said second buffer is connected through a resistor to a source Vss; and said third power input of said second buffer is connected to a source Vss.

2. A TTL to CMOS input buffer as recited in claim 1, wherein:
   said first buffer includes a plurality of transistors of which the current electrodes are serially connected between said second power input and said third power input of said first buffer; a control electrode of one of said serially connected plurality of transistors in said first buffer is connected to said first power input of said first buffer;
   said second buffer includes a plurality of transistors of which the current electrodes are serially connected between said first power input and said second power input of said second buffer; a control electrode of said plurality of serially connected transistors in said second buffer is connected to said third power input of said second buffer.

3. A TTL to CMOS input buffer as recited in claim 2, wherein:
   said plurality of serially connected transistors in said first buffer includes
   first and second P channel MOS transistors and first, second, and third N channel MOS transistors;
   said plurality of serially connected transistors in said second buffer includes first and second P channel MOS transistors and a first N channel MOS transistor.

4. A TTL to CMOS input buffer as recited in claim 3, wherein in said first buffer:
   said first P channel MOS transistor has its source connected to said first power input and its drain connected to the source of said second P channel MOS transistor;
   said second P channel transistor has its drain connected to the drain of said first N channel transistor;
   said first N channel transistor has its source connected to the drain of said second N channel transistor;
   said second N channel transistor has its source connected to the drain of said third N channel transistor; and
   said third N channel has its source connected to said third power input.

5. A TTL to CMOS input buffer as recited in claim 4, wherein in said second buffer:
   said first P channel MOS transistor has its source connected to said first power input and its drain connected to the source of said second P channel MOS transistor;

said second P channel MOS transistor has its drain connected to the drain of said first N channel MOS transistor;

said first N channel MOS transistor has its source connected to said second power input.

6. A TTL to CMOS input buffer as recited in claim 5, wherein:

said first buffer further includes a fourth N channel MOS transistor of which the drain is connected to a point of connection between the drain of said second P channel transistor of said first buffer and the drain of said first N channel MOS transistor of said first buffer, and of which the source is connected to said third power input of said first buffer.

7. A TTL to CMOS input buffer as recited in claim 6, wherein:

said second buffer further includes a second N channel MOS transistor of which the drain is connected to a point of connection between the drain of said second P channel MOS transistor of said second buffer and the drain of said first N channel MOS transistor of said second buffer, and of which the source is connected to said third power input of said second buffer.

8. A TTL to CMOS input buffer as recited in claim 7, wherein:

said signal supplied from said first buffer to said second buffer is taken from a point of connection in said first buffer between the drain of said second P channel MOS transistor, the drain of said first N channel transistor, and the drain of said fourth N channel MOS transistor; and said output signal provided by said second buffer is taken from a point of connection in said second buffer between the drain of said second P channel MOS transistor, the drain of said first N channel MOS transistor, and the drain of said second N channel MOS transistor.

9. A TTL to CMOS input buffer as recited in claim 8, wherein in said first buffer;

the gate of said first P channel MOS transistor, and the gate and the source of said fourth N channel MOS transistor are also connected to said third power input;

the gate of said second P channel MOS transistor, the gate of said second N channel MOS transistor and the gate of said third N channel MOS transistor are all connected to said TTL input; and the gate of said first N channel MOS transistor is connected to said first power input.

10. A TTL to CMOS input buffer as recited in claim 8, wherein in said second buffer;

the gate of said first P channel MOS transistor, the gate of said second N channel MOS transistor, and the source of said second N channel MOS transistor are all connected to said third power input; and the gate of said second P channel MOS transistor and the gate of said first N channel MOS transistor both receive said signal supplied from said first buffer.

11. A TTL to CMOS input buffer as recited in claim 9, wherein in said second buffer:

the gate of said first P channel MOS transistor, the gate of said second N channel MOS transistor, and the source of said second N channel MOS transistor are all connected to said third power input; and the gate of said second P channel MOS transistor and the gate of said first N channel MOS transistor both receive said signal supplied from said first buffer.

* * * * *